(12) United States Patent
Iguchi (10) Patent No.: US 8,946,749 B2
(45) Date of Patent: Feb. 3, 2015

(54) SEMICONDUCTOR LIGHT EMITTING DEVICE

(71) Applicant: Katsuji Iguchi, Osaka (JP)

(72) Inventor: Katsuji Iguchi, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 13/682,224

(22) Filed: Nov. 20, 2012

(65) Prior Publication Data

US 2013/0126927 A1   May 23, 2013

(30) Foreign Application Priority Data

Nov. 21, 2011   (JP) .................................. 2011-254128

(51) Int. Cl.
*H01L 33/60*   (2010.01)
*H01L 33/58*   (2010.01)

(52) U.S. Cl.
CPC ................ *H01L 33/60* (2013.01); *H01L 33/58* (2013.01); *H01L 2224/48091* (2013.01); *H01L 2224/73265* (2013.01)
USPC   257/98; 257/E33.06; 257/659; 257/E23.114; 257/E21.214

(58) Field of Classification Search
CPC .............. H01L 33/22; H01L 21/02494; H01L 21/02587; H01L 33/24; H01L 33/60; H01L 2251/5361; H01L 27/3251; H01L 33/58; H01L 21/67115; H01L 33/405; H01L 33/46; H01L 51/5275
USPC ........ 257/98, E33.06, 659, E23.114, E21.214
See application file for complete search history.

(56) References Cited

U.S. PATENT DOCUMENTS

| 2007/0075325 | A1  | 4/2007  | Baek et al. |
| 2007/0267646 | A1* | 11/2007 | Wierer et al. .................... 257/98 |
| 2010/0027282 | A1* | 2/2010  | Gebauer et al. ................ 362/487 |
| 2010/0202142 | A1* | 8/2010  | Morgan ........................ 362/235 |

FOREIGN PATENT DOCUMENTS

| JP | 2005-317592 | 11/2005 |
| JP | 2006-287132 | 10/2006 |
| JP | 2010-45168  | 2/2010  |
| JP | 2010-206231 | 9/2010  |
| JP | 2011-114116 | 6/2011  |

* cited by examiner

*Primary Examiner* — Cathy N Lam
(74) *Attorney, Agent, or Firm* — Morrison & Foerster LLP (57) ABSTRACT

A semiconductor light emitting device includes a substrate having a wiring pattern formed thereon, and a semiconductor light emitting element mounted on one main surface of the substrate and electrically connected to the wiring pattern. The substrate has, on the one main surface, a serrated structure reflecting at least part of light emitted from said semiconductor light emitting element to the substrate, to a direction perpendicular to the one main surface.

15 Claims, 10 Drawing Sheets

SEMICONDUCTOR LIGHT EMITTING DEVICE

This nonprovisional application is based on Japanese Patent Application No. 2011-254128 filed with the Japan Patent Office on Nov. 21, 2011, the entire contents of which are hereby incorporated by reference.

BACKGROUND OF THE INVENTION

1. Field of the Invention

The present invention relates to a semiconductor light emitting device.

2. Description of the Background Art

A semiconductor light emitting element such as a light emitting diode has advantageous characteristics of small size, low power consumption and stable emission of high luminance. Recently, there is an increasing trend of replacing illuminating apparatuses using, for example, incandescent lamps, to illuminating apparatuses using light emitting devices formed of LEDs (Light Emitting Diodes) emitting white light.

A semiconductor light emitting element includes a chip having a rectangular parallelepiped outer shape of about 300 μm square when viewed two-dimensionally. Light is emitted in all directions from the chip. Therefore, when the semiconductor light emitting element is used for general illumination or as a backlight of a liquid crystal display device, it is necessary to regulate the direction of light emission to a prescribed direction.

Therefore, generally, for a mounting board on which the semiconductor light emitting element is mounted or for a package sealing the semiconductor light emitting element, a material having high reflectance with respect to wavelength of light emitted from the semiconductor light emitting element is used. Alternatively, a reflector or the like is provided.

Japanese Patent Laying-Open No. 2005-317592 (Patent Literature 1) is a prior art disclosing a light emitting device having a light reflecting member. The light emitting device described in Patent Literature 1 has a base formed of ceramic having a rectangular shape when viewed two-dimensionally, and a protruding portion formed parallel to the shorter sides and across opposite longer sides of upper main surface of the base, with a light emitting device mounting portion formed on an upper surface. The light emitting device further has: a frame-like reflecting member having a recessed portion at a lower surface, which fits the protruding portion of the upper main surface, and joined to surround the mounting portion, with an inner peripheral surface formed as a reflecting surface to reflect the light emitted from the light emitting element; and a conductive layer formed at an upper surface of the protruding portion, to which the light emitting element is electrically connected.

Japanese Patent Laying-Open No. 2006-287132 (Patent Literature 2) is a prior art disclosing a package for a light emitting diode. In the package for light emitting diode described in Patent Literature 2, a cover body having an opening with a light reflecting surface is attached to an upper portion of a base for mounting a light emitting diode element. The base and the cover are formed of alumina ceramic having pore diameter of 0.10 to 1.25 μm, or alumina ceramic having porosity of at least 10%.

SUMMARY OF THE INVENTION

The light emitted downward from a semiconductor light emitting element cannot efficiently be utilized simply by increasing reflectance at an upper surface of the substrate mounting the semiconductor light emitting element. The reason for this is that the efficiency of using light cannot be improved unless the light emitted from the semiconductor light emitting element is reflected in a direction perpendicular to the upper surface of the mounting substrate.

The light emitted downward from the semiconductor light emitting element has small incident angle to the upper surface of mounting substrate. Therefore, the ratio of reflection to the direction perpendicular to the upper surface of mounting substrate is small. Thus, there is still a margin for further improving the efficiency of utilizing light.

Therefore, an object of the present invention is to provide a semiconductor light emitting device with improved efficiency of using light.

According to an aspect, the present invention provides a semiconductor light emitting device, including: a substrate provided with a wiring pattern; and a semiconductor light emitting element mounted on one main surface of the substrate and electrically connected to the wiring pattern. The substrate has, on the one main surface, a serrated structure for reflecting at least part of light, emitted from the semiconductor light emitting element to the substrate, in a direction perpendicular to the one main surface.

In a form of the present invention, the serrated structure includes a plurality of serrated structures positioned in concentric circular patterns with the semiconductor light emitting element being the center, when viewed two-dimensionally.

In a form of the present invention, the serrated structure includes a plurality of serrated structures positioned in concentric rectangular patterns with the semiconductor light emitting element being the center, when viewed two-dimensionally.

In a form of the present invention, the serrated structure includes a plurality of serrated structures positioned in concentric rectangular patterns on an inner side and in concentric circular patterns on an outer side, with the semiconductor light emitting element being the center, when viewed two-dimensionally.

In a form of the present invention, the substrate further has a reflector portion having a substantially rectangular outer shape when viewed two-dimensionally and surrounding an edge. The serrated structure includes a plurality of serrated structures extending in a direction perpendicular to the longitudinal direction of the substrate and positioned spaced from each other in the longitudinal direction.

In a form of the present invention, the serrated structures are further positioned in rectangular patterns to surround the semiconductor light emitting element.

Preferably, the serrated structure is positioned not to overlap with a position of connection between the wiring pattern and the semiconductor light emitting element.

Preferably, the serrated structure is formed apart by a distance at least 1 and at most 1.5 times the thickness of the semiconductor light emitting element, from a peripheral side surface of the semiconductor light emitting element.

In a form of the present invention, the serrated structure has a saw-tooth shape in transverse section, and has a plurality of inclinations serving as reflecting surfaces for reflecting light emitted from the semiconductor light emitting element. Where H represents the thickness of the semiconductor light emitting element, L represents the shortest distance between a crossing line of the closest inclination closest to the semiconductor light emitting element among the plurality of inclinations and the one upper surface and the peripheral side surface of the semiconductor light emitting element, and θ represents an inner angle formed by the closest inclination and the one upper surface, the closest inclination satisfies the relation of $2\theta=90°-\tan^{-1}(H/L)$.

Preferably, the relation of $30°\leq\theta\leq45°$ is satisfied.

In a form of the present invention, where Lp represents distance between vertexes of adjacent peaks, h represents height of the vertex, and θp represents an inner angle of the inclination positioned between each of the vertexes in the transverse section of the serrated structure, the relation of Lp=h/tan θp is satisfied.

In a form of the present invention, the serrated structure is formed of ceramic.

In a form of the present invention, the serrated structure is formed of metal.

In a form of the present invention, the serrated structure has its surface mirror-finished.

In a form of the present invention, the serrated structure has its surface formed of silver.

By the present invention, efficiency of using light from the semiconductor light emitting device can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, a semiconductor light emitting device in accordance with Embodiment 1 of the present invention will be described. In the following description of the embodiments, the same or corresponding components in the figures are denoted by the same reference characters, and description thereof will not be repeated. For convenience of description, expressions such as up/down, upper, lower, left and right will be used. These expressions, however, simply refer to the directions in the figures, and do not limit the structure of the invention.

Embodiment 1

Figure 1:
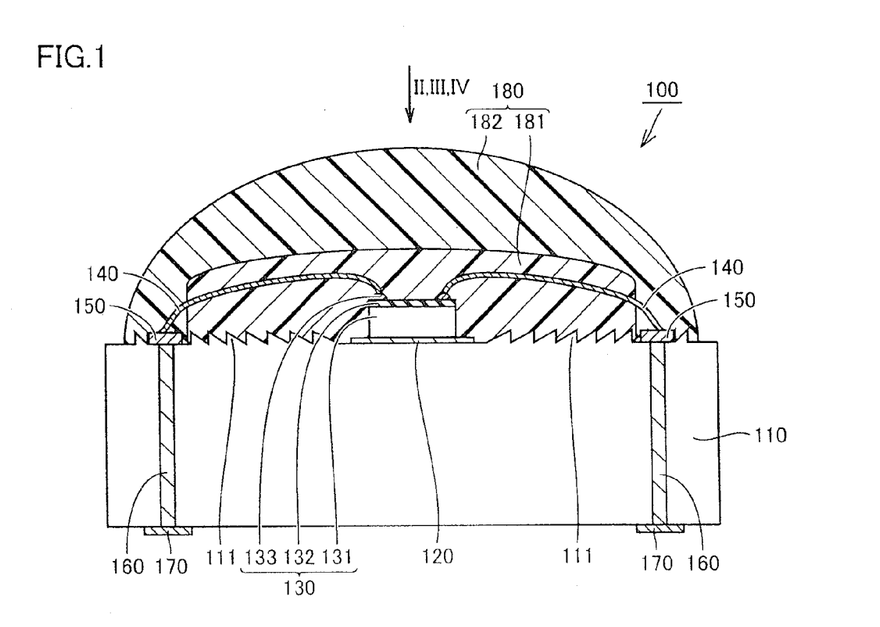
FIG. 1 is a cross-sectional view showing a structure of a semiconductor light emitting device in accordance with Embodiment 1 of the present invention.
Figure 2:
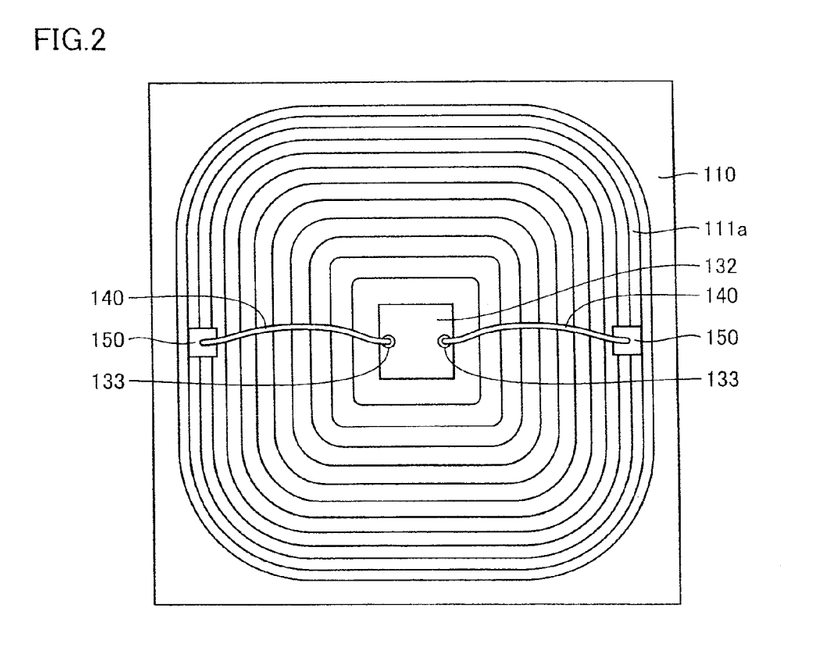
FIG. 2 is a plan view from the direction of an arrow II of FIG. 1, of the semiconductor light emitting device in accordance with Embodiment 1.
Figure 3:
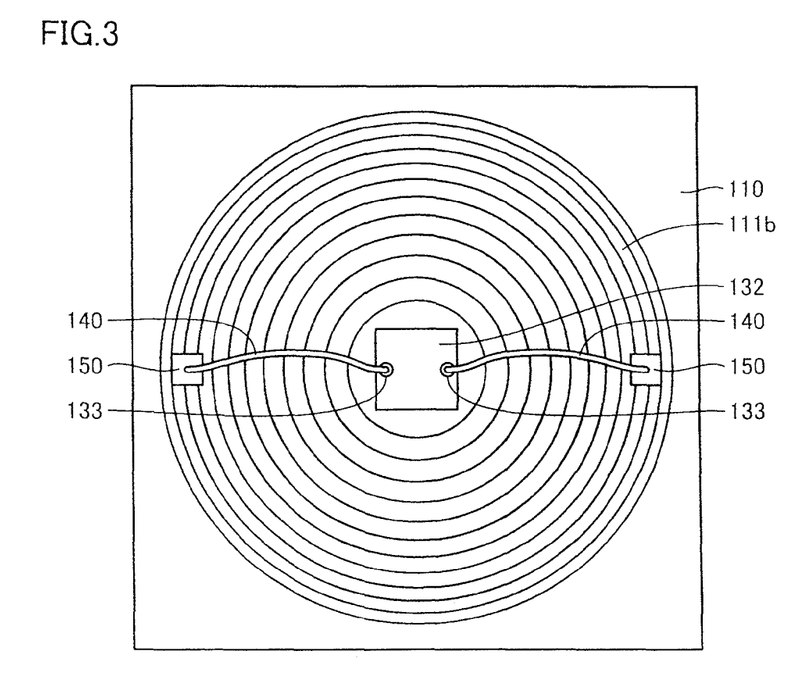
FIG. 3 is a plan view from the direction of an arrow III of FIG. 1, of the semiconductor light emitting device in accordance with a first modification of Embodiment 1.
Figure 4:
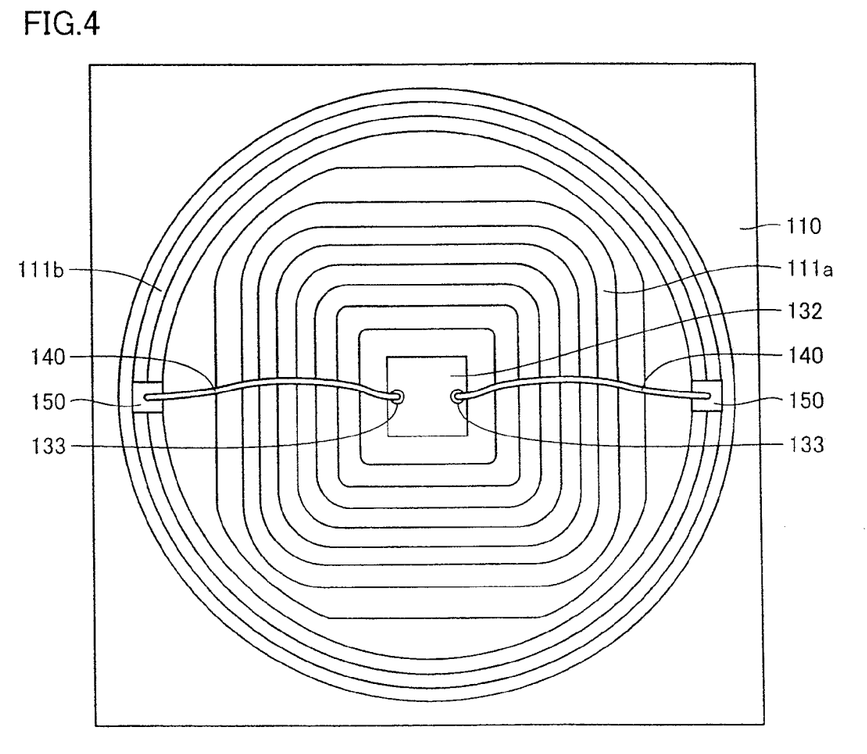
FIG. 4 is a plan view from the direction of an arrow IV of FIG. 1, of the semiconductor light emitting device in accordance with a second modification of Embodiment 1.

FIG. 1 is a cross-sectional view showing a structure of a semiconductor light emitting device in accordance with Embodiment 1 of the present invention. FIG. 2 is a plan view from the direction of an arrow II of FIG. 1, of the semiconductor light emitting device in accordance with Embodiment 1. FIG. 3 is a plan view from the direction of an arrow III of FIG. 1, of the semiconductor light emitting device in accordance with a first modification of Embodiment 1. FIG. 4 is a plan view from the direction of an arrow IV of FIG. 1, of the semiconductor light emitting device in accordance with a second modification of Embodiment 1.

As shown in FIG. 1, a semiconductor light emitting device 100 in accordance with Embodiment 1 includes a substrate 110 on which a wiring pattern is formed, and a semiconductor light emitting element 130 mounted on an upper surface as one main surface of substrate 110 and electrically connected to the wiring pattern. In the present embodiment, semiconductor light emitting element 130 is covered by a phosphor layer 181, and phosphor layer 181 is covered by a transparent resin layer 182. Phosphor layer 181 and transparent resin layer 182 form a sealing portion 180.

Substrate 110 is formed, for example, of ceramic. As a part of the wiring pattern, electrode portions 170 and through holes 160 connected to electrode portions 170 and extending to the upper surface of substrate 110 are formed, on a lower surface of substrate 110. Further, as a part of the wiring pattern, bonding pads 150 electrically connected to through holes 160 are formed on the upper surface of substrate 110. Bonding pads 150, through holes 160 and electrode portions 170 are formed of electrically conductive material.

A die pad 120 is provided approximately at the center of the upper surface of substrate 110. Die pad 120 is formed, for example, by applying and curing a silver (Ag) paste. On the upper surface of substrate 110, a serrated structure 111, which will be described later, is formed. The serrated structure 111 is formed not to overlap with the position where die pad 120 is formed.

Semiconductor light emitting element 130 emits light of any of red (R), green (G) and blue (B) colors. By way of example, semiconductor light emitting element 130 has a size of 0.3 mm square when viewed two-dimensionally. Semiconductor light emitting element 130 contains GaN, sapphire, GaAs, AlGaInP or the like, depending on the color of emission.

In the present embodiment, semiconductor light emitting element 130 emitting blue light is used. Semiconductor light emitting element 130 includes a sapphire substrate 131, a semiconductor layer 132 of InGaN/GaN layer formed on sapphire substrate 131, and an electrode pad 133 formed of a conductive material on a part of the upper surface of semiconductor layer 132.

That surface of sapphire substrate 131 which is opposite to the side of semiconductor layer 132 is adhered by means of die-pad 120 to the upper surface of substrate 110 and thus, semiconductor light emitting element 130 is fixed on substrate 110.

Electrode pad 133 and bonding pad 150 are connected by a wire 140 of gold (Au). As a result, semiconductor light emitting element 130 is electrically connected to the wiring pattern of substrate 110.

Phosphor layer 181 is formed of a resin that passes the light emitted from semiconductor light emitting element 130. Phosphor layer 181 is formed, for example, of transparent epoxy resin or silicone resin. A plurality of fluorescent particles are contained dispersed in phosphor layer 181. The light emitted from semiconductor light emitting element 130 has its wavelength converted by the fluorescent particles. As a result, light having wavelength different from that of light emitted from semiconductor light emitting element 130 goes out from phosphor layer 181.

Fluorescent particles that can preferably be used include, for example, BOSE (Ba, O, Sr, Si, Eu). In addition to BOSE, SOSE (Sr, Ba, Si, O, Eu), YAG (Ce activated yttrium.aluminum.garnet), α sialon ((Ca), Si, Al, O, N, Eu), β sialon (Si, Al, O, N, Eu) or the like may preferably be used as the fluorescent particles.

Though an example in which semiconductor light emitting device 100 has phosphor layer 181 will be described, a light diffusion layer may be provided in place of phosphor layer 181. The light diffusion layer contains, dispersed therein, scattering particles containing powder of $TiO_2$, $SiO_2$, alumina, aluminum nitride, or mullite having grain diameter of at most about 10 μm, which scatter light emitted from semiconductor light emitting element 130. Further, in order to reduce unevenness of color, the light diffusion layer may contain a mixture of fluorescent particles and scattering particles.

Transparent resin layer 182 is formed of a resin that passes light emitted from semiconductor light emitting element 130 and phosphor layer 181. Transparent resin layer 182 is formed, for example, of transparent epoxy resin or silicone resin. In order to improve light-extraction efficiency from semiconductor light emitting element 130, transparent resin layer 182 should preferably have an index of refraction smaller than that of phosphor layer 181.

In semiconductor light emitting device 100, light as a mixture of primary light emitted from semiconductor light emitting element 130 and secondary light emitted from phosphor layer 181 passes through transparent resin layer 182 and is output to the outside. By appropriately combining the color of emission from semiconductor light emitting element 130 and the color of emission from phosphor layer 181, the color output from semiconductor light emitting device 100 can freely be selected.

In the following, the serrated structure 111 will be described.

As shown in FIG. 2, in semiconductor light emitting device 100 in accordance with the present embodiment, there are a plurality of serrated structures 111a provided in concentric rectangular patterns with semiconductor light emitting element 130 positioned at the center, when viewed two-dimensionally. Though corners of the rectangle are rounded in the present embodiment, the corners may be right-angled.

As shown in FIG. 3, in the semiconductor light emitting device in accordance with a first modification, there are a plurality of serrated structures 111b provided in concentric circular patterns with semiconductor light emitting element 130 positioned at the center, when viewed two-dimensionally.

As shown in FIG. 4, in the semiconductor light emitting device in accordance with a second modification, serrated structures 11 are positioned concentrically with semiconductor light emitting element 130 positioned at the center, forming rectangular patterns on the inner side and forming circular patterns on the outer side. More specifically, with semiconductor light emitting element 130 positioned at the center, the serrated structures are formed in rectangular patterns near semiconductor light emitting element 130 and gradually changed to circular patterns away from semiconductor light emitting element 130.

With such an approach, in the vicinity of semiconductor light emitting element 130, the light proceeding in a direction perpendicular to the side surface of semiconductor light emitting element 130 can be reflected with high efficiency by serrated structures 111a provided as rectangular patterns, and as the distance from semiconductor light emitting element 130 increases, the light proceeding radially from semiconductor light emitting element 130 can be reflected uniformly by serrated structures 111b provided as circular patterns.

As shown in FIGS. 1 to 4, serrated structures 111 are positioned not to overlap with bonding pads 150 as the positions of connection between the wiring pattern and semiconductor light emitting element 130. Specifically, serrated structure 111 is not formed below bonding pad 150. By this arrangement, it becomes possible to make flat the upper surface of bonding pad 150 and to stably connect wire 140 to bonding pad 150. Thus, connection failure of wire 140 can be prevented.

Figure 5:
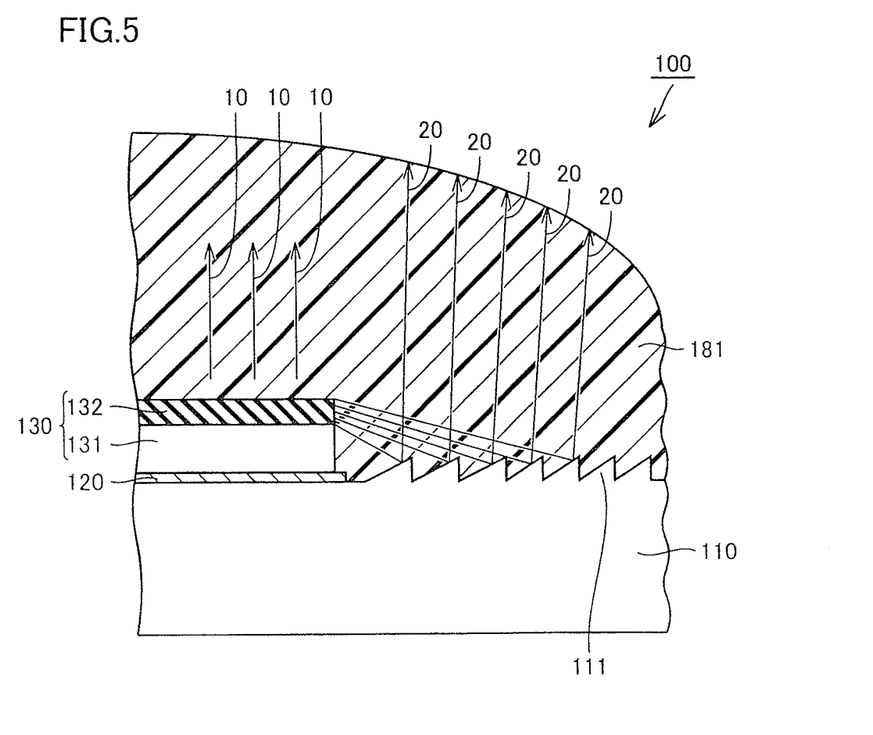
FIG. 5 is a partial cross-sectional view showing part of light emitted from the semiconductor light emitting element reflected by the serrated structures.
Figure 6:
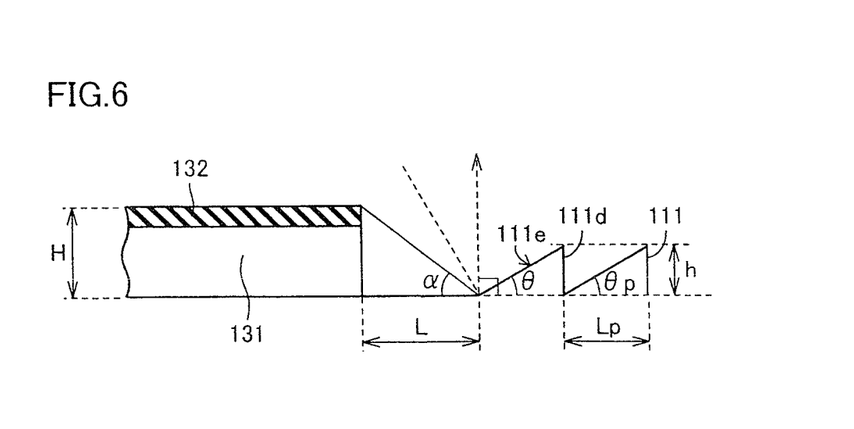
FIG. 6 is a partial cross-sectional view showing a relation of arrangement between the semiconductor light emitting element and the serrated structures.

FIG. 5 is a partial cross-sectional view showing part of light emitted from the semiconductor light emitting element reflected by the serrated structures. FIG. 6 is a partial cross-sectional view showing a relation of arrangement between the semiconductor light emitting element and the serrated structures.

Referring to FIGS. 5 and 6, only a part of light emitted from semiconductor light emitting element 130 is shown as an example. Light is emitted radially from semiconductor light emitting element 130. Further, in the example of FIG. 6, thickness of die pad 120 is very thin as compared with the thickness of semiconductor light emitting element 130 and, therefore, semiconductor light emitting element 130 is shown as if its lower surface is directly in contact with an upper surface of substrate 110.

As shown in FIG. 5, light 10 emitted from semiconductor light emitting element 130 in a direction perpendicular to the upper surface of substrate 110 proceeds directly and propagates through phosphor layer 181. On the other hand, light 20 emitted from semiconductor light emitting element 130 in a direction toward the upper surface of substrate 110 is reflected by the upper surface of substrate 110.

As shown in FIGS. 5 and 6, substrate 110 has serrated structures 111 provided on its upper surface, for reflecting at least part of light 20 emitted from semiconductor light emitting element 130 to substrate 110, in a direction perpendicular to the upper surface. Because of such an arrangement, the efficiency of using light emitted from semiconductor light emitting element 130 can be improved.

At the upper surface of substrate 110, not much light is emitted to a position near the peripheral side wall of semiconductor light emitting element 130. Therefore, serrated structure formed on such a position is not very effective. Therefore, the serrated structure is formed, for example, from a position spaced apart by a distance L, which is 1 to 1.5 times the thickness H of semiconductor light emitting element 130, from the peripheral side surface of semiconductor light emitting element 130. Specifically, the distance between the serrated structure 111d closest to semiconductor light emitting element 130 and the semiconductor light emitting element 130 may be set to the distance L. By such an arrangement, efficiency of using light can be improved effectively, by omitting ineffective serrated structure 111.

In semiconductor light emitting device 100 in accordance with the present embodiment, serrated structure 111 has a saw-tooth shape in transverse section, and has a plurality of inclinations serving as reflecting surfaces for reflecting light emitted from semiconductor light emitting element 130.

As shown in FIG. 6, when we represent the thickness of semiconductor light emitting element 130 by H, the shortest distance between a crossing line of the closest inclination 111e closest to semiconductor light emitting element 130 among the plurality of inclinations and the upper surface of substrate 110 and the peripheral side surface of semiconductor light emitting element 130 by L, and an inner angle formed by the closest inclination 111e and the upper surface of substrate 110 by θ, it is preferred that the closest inclination 111e satisfies the relation of $2\theta=90°-\tan^{-1}(H/L)$. Here, as shown in FIG. 6, $\tan^{-1}(H/L)=\alpha$.

With this structure, the light incident on closest inclination 111e from an end of an upper surface of semiconductor light emitting element 130 can be reflected in a direction perpendicular to the upper surface of substrate 110. Therefore, most of the light emitted from semiconductor light emitting element 130 to substrate 110 can be reflected in a direction perpendicular to the upper surface of substrate 110, and the efficiency of using light can be improved.

When the relation mentioned above is satisfied, the inner angle θ becomes larger as the distance L becomes longer. Practically, if the relation of $30°\leq\theta\leq45°$ is satisfied, it becomes possible to effectively reflect light by closest inclination 111e and to improve light using efficiency.

Further, each of the plurality of serrated structures 111 should preferably satisfy the relation of $Lp=h/\tan\theta p$, where Lp represents the distance between vertexes of adjacent peaks, h represents the height of the vertex, and θp represents an inner angle of the inclination positioned between each of the vertexes. By such an arrangement, it becomes possible to arrange the plurality of serrated structures 111 each having a right-triangular shape in transverse section, continuously with each other.

In the present embodiment, a blue light emitting element of which emission peak wavelength is 450 nm is used as semiconductor light emitting element 130. Semiconductor light emitting element 130, however, is not limited to this.

Figure 7:
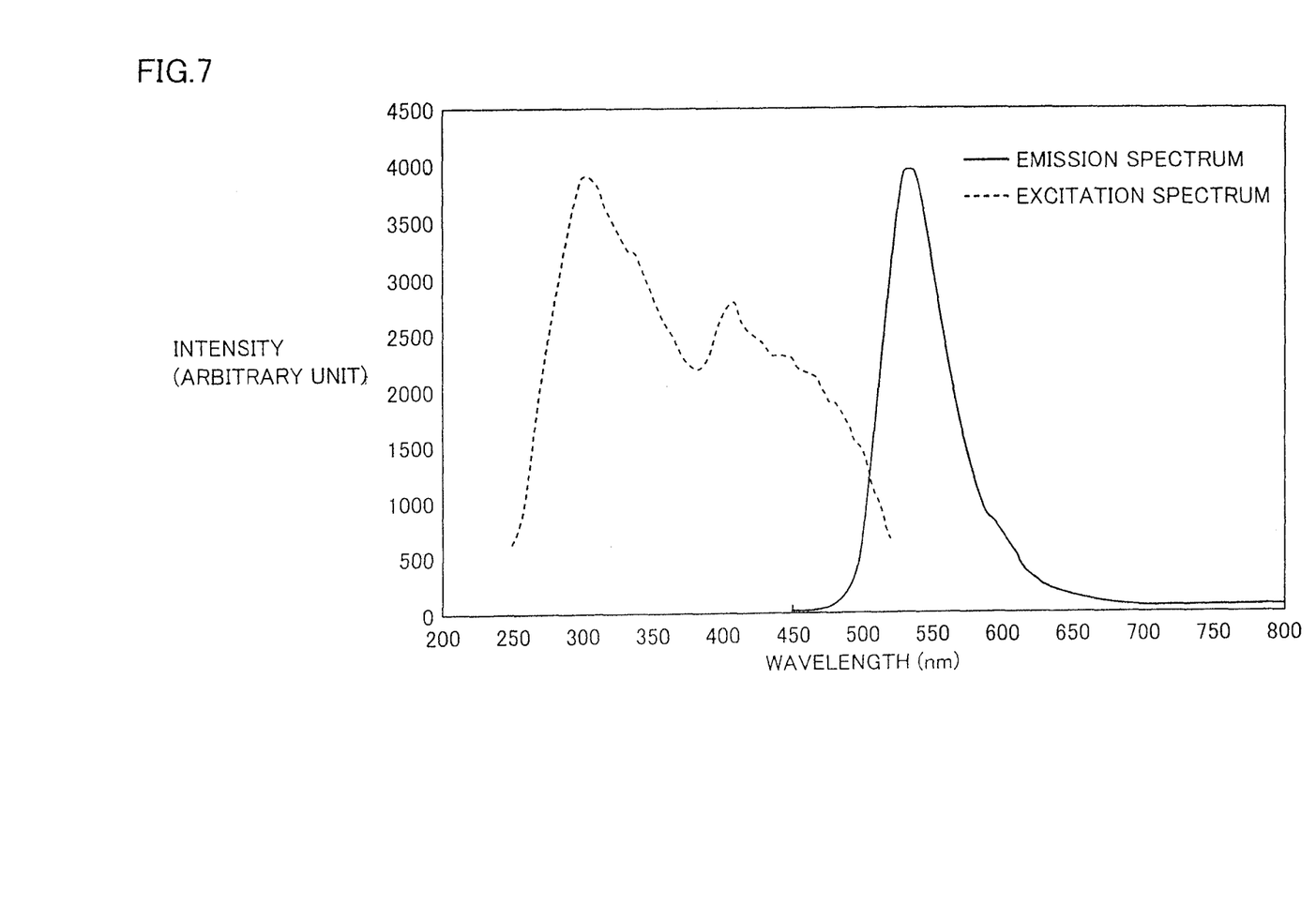
FIG. 7 is a graph showing excitation spectrum and emission spectrum of fluorescent particles included in a phosphor layer.

FIG. 7 is a graph showing excitation spectrum and emission spectrum of fluorescent particles included in a phosphor layer. In FIG. 7, the ordinate represents light intensity, and the abscissa represents light wavelength. Further, the excitation spectrum is represented by a dotted line and the emission spectrum is represented by a solid line. Here, data of β sialon fluorescent body as the fluorescent particles is shown.

As shown in FIG. 7, many fluorescent particles included in phosphor layer 181 have high excitation spectrum in ultraviolet range. If fluorescent particles are excited using light having wavelength of visible range, it is sometimes the case that an edge portion of excitation spectrum of the fluorescent particles is used. In that case, by using an ultraviolet (near-ultra violet) semiconductor light emitting element of which emission peak wavelength is at least 390 nm and at most 420 nm, for example, emission efficiency of phosphor layer 181 can be improved.

Though sealing portion 180 is formed by phosphor layer 181 and transparent resin layer 182 in the present embodiment, sealing portion 180 is not limited to the above, and sealing portion 180 may be formed, for example, by a glass layer that transmits light.

In this case also, it is possible to prevent light proceeding in sealing portion 180 from being totally reflected by the outer surface of sealing portion 180 and confined in sealing portion 180. As a result, efficiency of using light emitted from semiconductor light emitting element 130 can be improved.

In the following, a method of manufacturing semiconductor light emitting device 100 in accordance with the present embodiment will be described.

Figure 8:
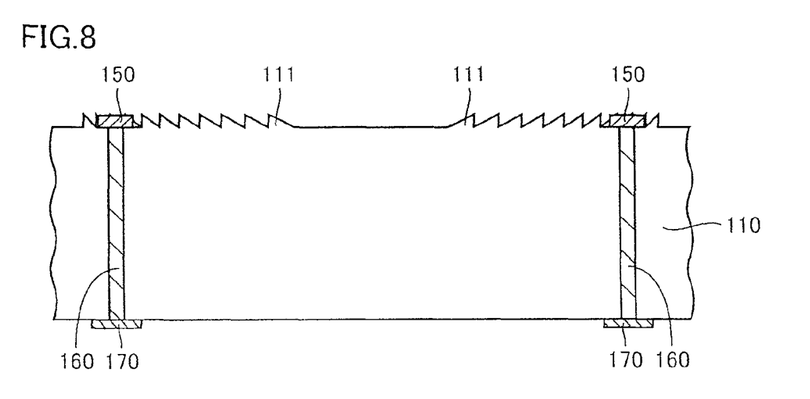
FIG. 8 is a partial cross-sectional view showing a structure of a substrate provided with a wiring pattern and the serrated structures.

FIG. 8 is a partial cross-sectional view showing a structure of a substrate provided with a wiring pattern and the serrated structures. As shown in FIG. 8, substrate 110 is prepared, which has bonding pads 150 for wire bonding provided on the upper surface, electrode portions 170 for connection to an external circuit formed on the lower surface, and through holes 160 communicating these to enable power supply to semiconductor light emitting element 130. Preferable material of substrate 110 is, for example, ceramic with high light reflectance.

If a ceramic substrate is used as substrate 110, by forming a desirable serrated shape in advance in a green-sheet state and burning the green sheet, a ceramic substrate having serrated structures 111 can be fabricated. Here, serrated structures 111 are formed of ceramic.

Alternatively, a metal plate having serrated structures 111 on its surface may be fabricated separately, and it may be fit to desired portions of a ceramic substrate, to obtain substrate 110 having serrated structures 111. Here, serrated structures 111 are formed of metal.

Preferably, the surface of serrated structures 111 is mirror-finished. Thus, light reflectance of serrated structures 111 can be improved. Further, it is preferred that the surface of serrated structures 111 is formed of silver. Here, light reflectance of serrated structures 111 when the wavelength of light emitted from semiconductor light emitting element 130 is at least 370 nm and at most 550 nm can be improved.

Figure 9:
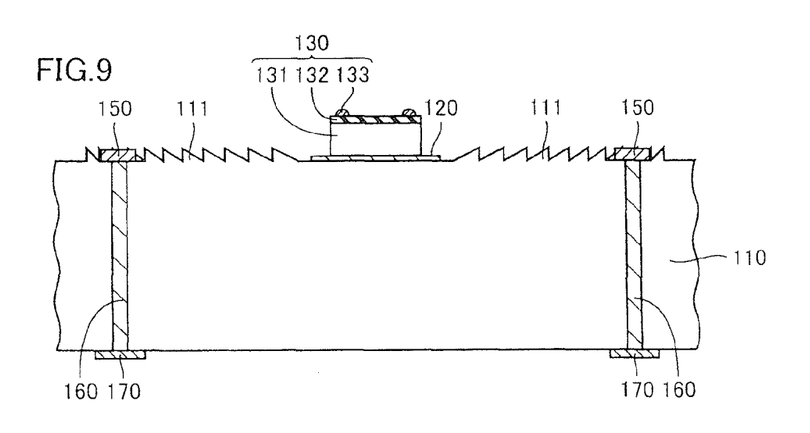
FIG. 9 is a partial cross-sectional view showing a semiconductor light emitting element die-bonded on the substrate.

FIG. 9 is a partial cross-sectional view showing a semiconductor light emitting element die-bonded on the substrate. As shown in FIG. 9, semiconductor light emitting element 130 is die-bonded to a prescribed position on the upper surface of substrate 110. On substrate 110, a plurality of semiconductor light emitting elements 130 are die-bonded spaced by a prescribed distance from each other.

Figure 10:
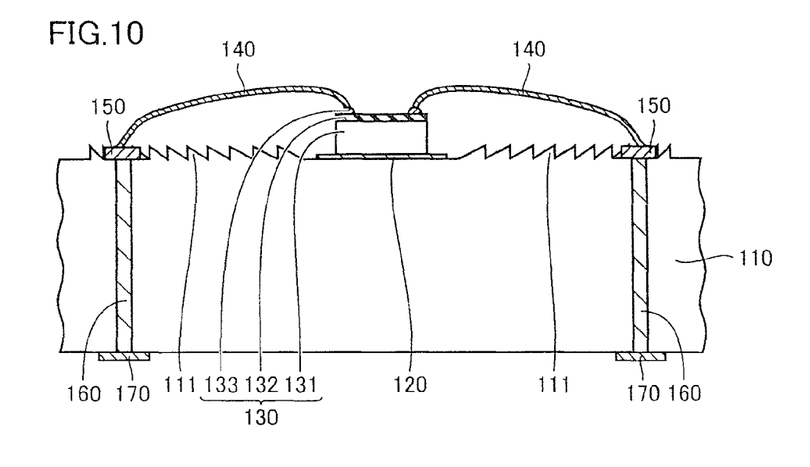
FIG. 10 is a partial cross-sectional view showing electrode pads and a bonding pad for the substrate in wire-bonded state.

FIG. 10 is a partial cross-sectional view showing electrode pads and a bonding pad for the substrate in wire-bonded state. As shown in FIG. 10, an electrode pad 133 of semiconductor light emitting element 130 and bonding pad 150 of substrate 110 are wire-bonded by a wire 140, to establish electric connection.

Figure 11:
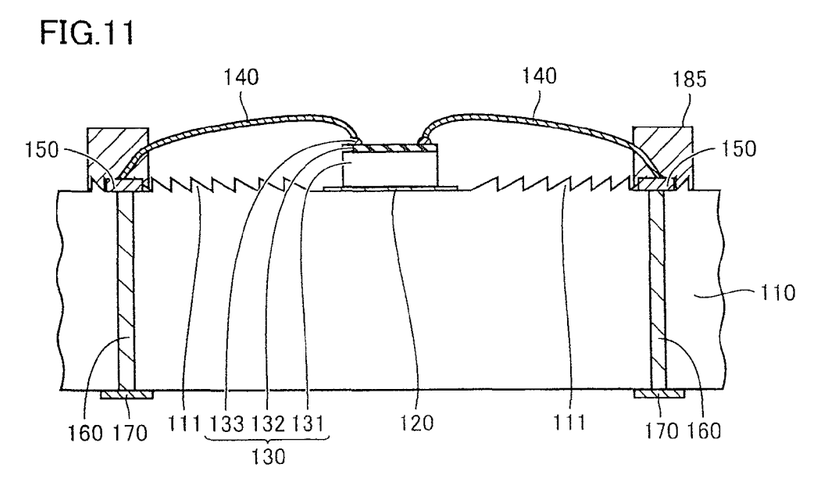
FIG. 11 is a partial cross-sectional view showing a dam sheet, as a blocking member for forming the phosphor layer, adhered to the substrate.

FIG. 11 is a partial cross-sectional view showing a dam sheet, as a blocking member for forming the phosphor layer, adhered to the substrate. As shown in FIG. 11, on the upper surface of substrate 110, a dam sheet 185 is adhered in a shape of a circle, with semiconductor light emitting element 130 being the center.

The thickness of dam sheet 185 is set in accordance with the thickness of phosphor layer 181. Further, the size of the area surrounded by the inner circumferential surface of dam sheet 185 is set in accordance with the size of phosphor layer 181.

Figure 12:
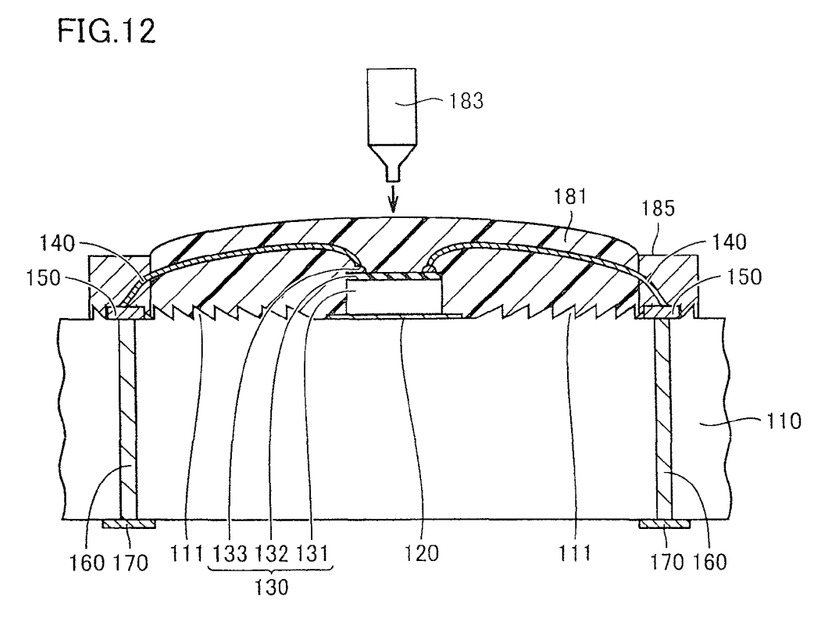
FIG. 12 is a partial cross-sectional view showing resin containing fluorescent particles, poured onto the substrate.

FIG. 12 is a partial cross-sectional view showing resin containing fluorescent particles, poured onto the substrate. As shown in FIG. 12, to the area surrounded by dam sheet 185 on substrate 110, resin containing fluorescent particles is poured through a nozzle 183. The resin is poured until it fills the area surrounded by dam sheet 185. Here, overflow of resin 185 to the outside of dam sheet 185 is prevented by surface tension of the resin.

As dam sheet 185, a sheet formed of resin, such as Teflon (registered trade mark) or fluoro-rubber, with an adhesive applied to one surface, may be used.

Fluoro-rubber is preferable, since it has high elasticity and dam sheet 185 can easily be removed when, as will be described later, dam sheet 185 is removed. As the adhesive, one that facilitates adhesion of dam sheet 185 to the upper surface of substrate 110 and not leaving any residue on the upper surface of substrate 110 when dam sheet 185 is removed, is preferred.

The resin containing fluorescent particles is cured by heating at a temperature of 150° C. for 120 minutes, and thereafter, dam sheet 185 is removed, so that phosphor layer 181 is formed. Dam sheet 185 may be removed by gripping and pulling part of dam sheet 185 using a jig. Here, part of the resin containing fluorescent particles running on the upper surface of dam sheet 185, if any, can also be removed, with dam sheet 185.

Figure 13:
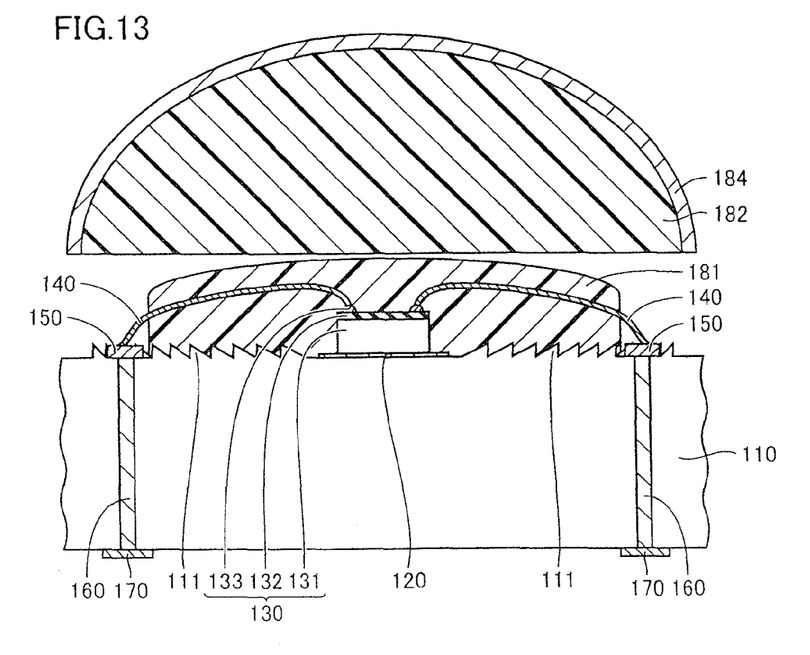
FIG. 13 is a partial cross-sectional view showing a mold die filled with transparent resin, arranged opposite to the phosphor layer.

FIG. 13 is a partial cross-sectional view showing a mold die filled with transparent resin, arranged opposite to the phosphor layer. As shown in FIG. 13, a transparent resin is filled to a cavity of a male die 184 of a mold, and the male die 184 is positioned facing phosphor layer 181.

Figure 14:
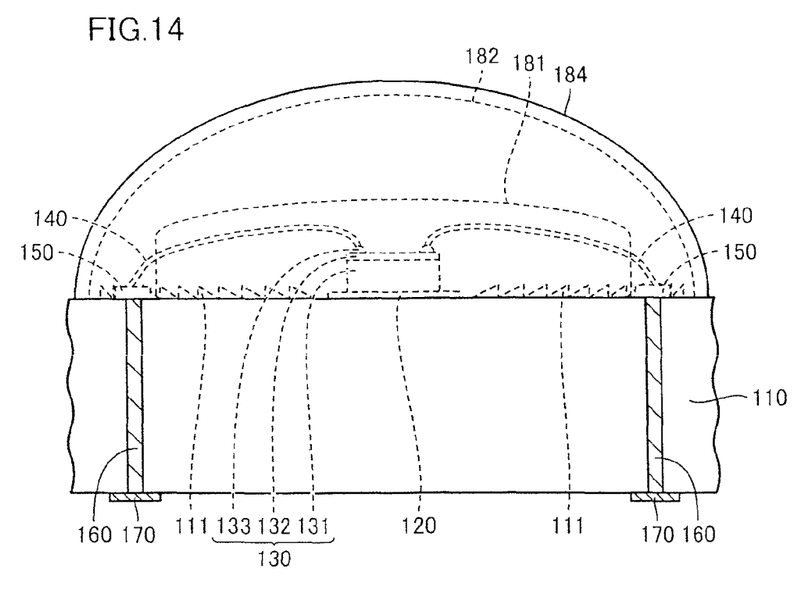
FIG. 14 is a partial cross-sectional view showing the phosphor layer covered by the mold die filled with transparent resin.

FIG. 14 is a partial cross-sectional view showing the phosphor layer covered by the mold die filled with transparent resin. As shown in FIG. 14, male die 184 is arranged such that phosphor layer 181 is contained in the cavity. Substrate 110 is set to a female die, not shown. Male die 184 and the female die are clamped using a base mold, not shown, and heated at 150° C. for about 1 minute, so that the transparent resin is cured. Thereafter, the mold dies are separated, and substrate 110 is removed from the female die.

If transparent resin layer 182 is formed by compression molding as described above, it is possible that adjacent transparent resin layers 182 are connected on substrate 110, and a thin film of transparent resin extends around peripheral edge portions of transparent resign layer 182 and covers the upper surface of substrate 110.

After-curing of heating at a temperature of 150° C. for two hours is executed and, thereafter, the resulting body is divided to individual semiconductor light emitting devices. The division may be done by cutting, with a cutter, along dicing lines formed on the lower surface of substrate 110, from the side of transparent resin layer 182. By this method, the film of transparent resin covering the upper surface of substrate 110 as described above can be cut by the cutter, and substrate 110 can be divided along the dicing lines. Therefore, the semiconductor light emitting devices can be divided into individual pieces easily. By the method as described above, semiconductor light emitting device 100 shown in FIG. 1 is obtained.

The ratio between phosphor layer 181 and transparent resin layer 182 when viewed two-dimensionally is appropriately set. It is noted, however, that the intensity of light emitted from semiconductor light emitting element 130 lowers as it goes away from semiconductor light emitting element 130. Therefore, phosphor layer 181 may be formed only in the vicinity of semiconductor light emitting element 130 and phosphor layer 181 may not be formed at a portion far from semiconductor light emitting element 130.

In such an arrangement, light of relatively high intensity emitted to the vicinity of semiconductor light emitting element 130 can be reflected by serrated structures 111 to enter phosphor layer 181, and light of relatively low intensity emitted away from semiconductor light emitting element 130 can be reflected by serrated structures 111 to enter transparent resin layer 182. As a result, light of low intensity that would otherwise be absorbed by phosphor layer 181 and not effectively be used can be reduced, and the efficiency of using light emitted from semiconductor light emitting element 130 can be improved.

Further, if phosphor layer 181 is formed using dam sheet 185 as described above, positional accuracy of phosphor layer 181 is determined by the positioning accuracy of darn sheet 185. Therefore, phosphor layer 181 can be formed with high positional accuracy. As a result, variation in luminance and color of light emitted from semiconductor light emitting devices 100 can be reduced.

In the following, a semiconductor light emitting device in accordance with Embodiment 2 of the present invention will be described.

Embodiment 2

Figure 15:
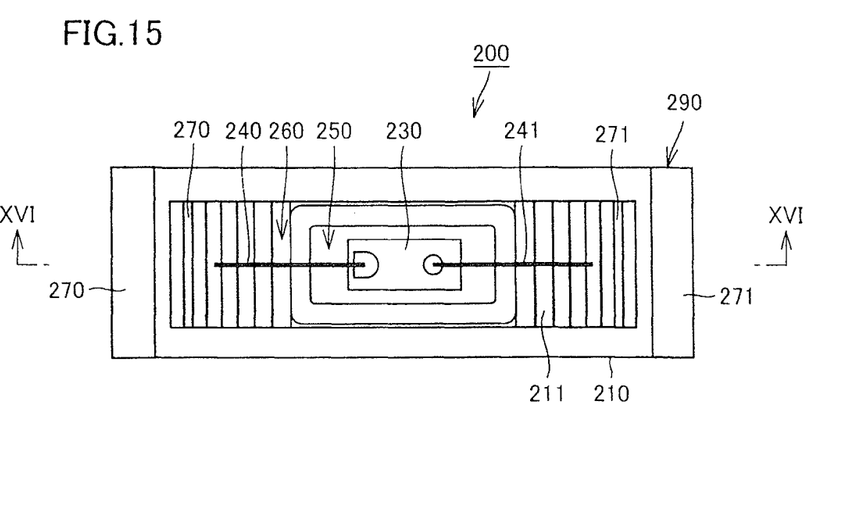
FIG. 15 is a plan view showing a structure of a semiconductor light emitting device in accordance with Embodiment 2 of the present invention.
Figure 16:
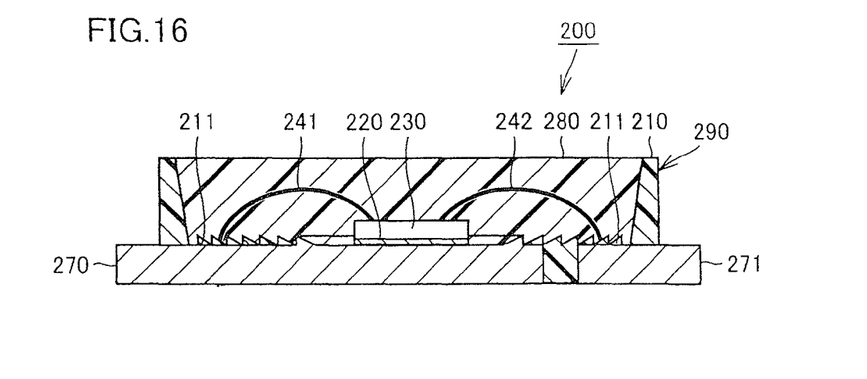
FIG. 16 is a cross-sectional view from the direction of an arrow XVI-XVI of FIG. 15.
Figure 17:
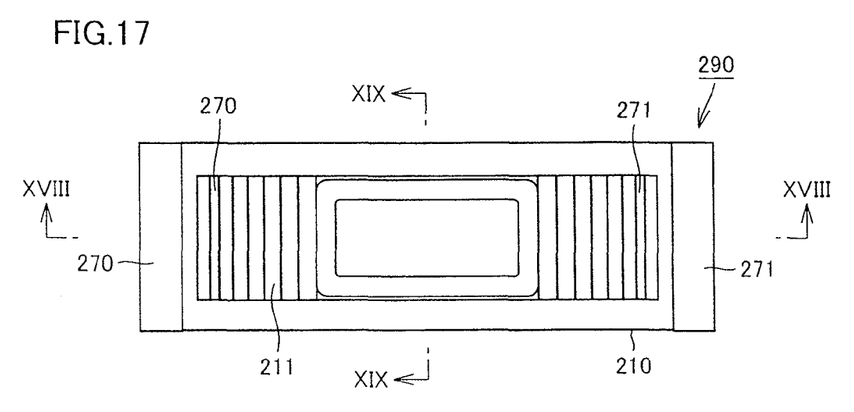
FIG. 17 is a plan view showing a structure of a package of the semiconductor light emitting device in accordance with Embodiment 2.
Figure 18:
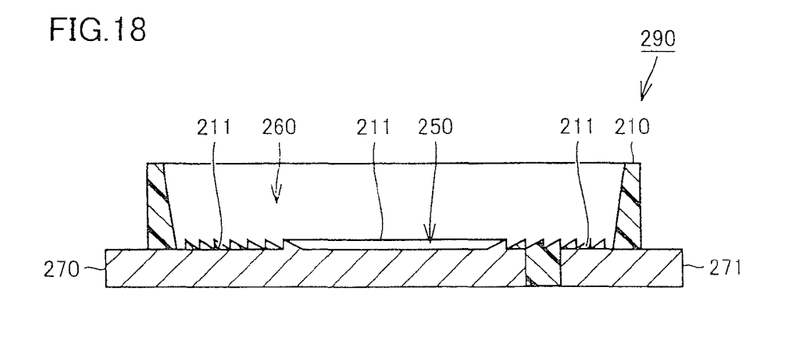
FIG. 18 is a cross-sectional view from the direction of an arrow XVIII-XVIII of FIG. 17.
Figure 19:
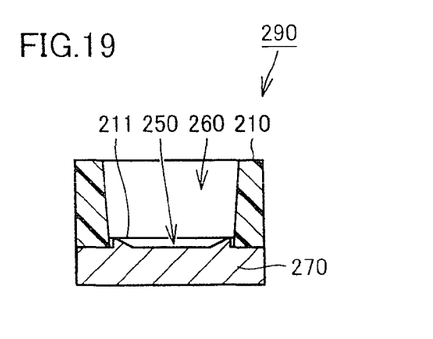
FIG. 19 is a cross-sectional view from the direction of XIX-XIX of FIG. 17.

FIG. 15 is a plan view showing a structure of a semiconductor light emitting device in accordance with Embodiment 2 of the present invention. FIG. 16 is a cross-sectional view from the direction of an arrow XVI-XVI of FIG. 15. FIG. 17 is a plan view showing a structure of a package of the semiconductor light emitting device in accordance with Embodiment 2. FIG. 18 is a cross-sectional view from the direction of an arrow XVIII-XVIII of FIG. 17. FIG. 19 is a cross-sectional view from the direction of XIX-XIX of FIG. 17.

As shown in FIGS. 15 to 19, a semiconductor light emitting device 200 in accordance with Embodiment 2 includes a semiconductor light emitting element 230 and a package 290. Package 290 includes a first lead frame 270 formed of metal, serving as one electrode and on which semiconductor light emitting element 230 is mounted, a second lead frame 271 formed of metal, serving as the other electrode, and a reflector portion 210 of white resin, injection molded integrally with the pair of first and second lead frames 270 and 271.

First and second lead frames 270 and 271 each have rectangular outer shape, when viewed two-dimensionally. First and second lead frames 270 and 271 are positioned spaced by a prescribed distance from each other. First and second lead frames 270 and 271 have a heat radiating function.

A substrate is formed by the first and second lead frames 270 and 271 and reflector portion 210 of package 290. The substrate has a substantially rectangular shape when viewed two-dimensionally. Reflector portion 210 is formed to surround the edge of substrate.

Semiconductor light emitting element 230 is fixed by an adhesive 220 applied on a mounting surface 250 of first lead frame 270. On mounting surface 250 of semiconductor light emitting element 230, metal surface of first lead frame 270 is exposed, or a metal layer such as silver plating formed on first lead frame 270 is exposed.

First lead frame 270 is wire-bonded by a wire 241 to one terminal of semiconductor light emitting element 230 and thus electrically connected. Second lead frame 271 is wire-bonded by a wire 242 to the other terminal of semiconductor light emitting element 230 and thus electrically connected.

At the wire bonding positions, desirably, a metal surface of first and second lead frames 270 and 271 or a metal layer such as silver plating formed on first and second lead frames 270 and 271 is exposed.

Serrated structures 211 are formed on first and second lead frames 270 and 271. In the present embodiment, the serrated structures are formed also on the white resin positioned between first and second lead frames 270 and 271. Serrated structures 211 in accordance with the present embodiment are the same in function as serrated structures 111 in accordance with Embodiment 1, and description of configurations similar to those of serrated structures 111 will not be repeated.

Serrated structures 211 extend in a direction perpendicular to the longitudinal direction of substrate, and the plurality of serrated structures are positioned spaced from each other along the longitudinal direction of the substrate. In the present embodiment, serrated structures 221 are further positioned in rectangular patterns to surround semiconductor light emitting element 230.

By forming serrated structures 211 in this manner, the light emitted from semiconductor light emitting element 230 to first and second lead frames 270 and 271 in an area surrounded by the inner wall surface of reflector portion 210 can be reflected effectively in a direction perpendicular to the upper surface of first and second lead frames 270 and 271.

As to the method of forming serrated structures 211 on first and second lead frames 270 and 271, serrated structures 211 may be formed integrally when first and second lead frames 270 and 271 are formed by press-molding.

As the white resin, a PKG (package) resin prepared by adding light diffusing agent such as titanium oxide to a thermosetting resin to provide reflecting characteristic may be used. As the thermosetting resin, resin having good heat resistance and light resistance is preferred. By way of example, silicone, epoxy, polyphthalamide (PPA) and an organic modified resin thereof may be used.

As shown in FIGS. 17 to 19, package 290 has a cavity 260. Cavity 260 has its periphery surrounded by reflector portion 210. Reflector portion 210 has a tapered inner wall surface that becomes wider toward the opening end of cavity 260. In the present embodiment, cavity 260 has a rectangular outer shape when viewed two dimensionally. The shape, however, is not limited to this, and it may have a polygonal or elliptical outer shape.

As shown in FIG. 16, cavity 260 is filled with sealing resin 280. Sealing resin 280 contains light scattering agent and fluorescent agent. By way of example, if semiconductor light emitting element 230 is a blue LED, by introducing fluorescent agents that emits red and green when receiving blue light to sealing resin 280, white light can be emitted from semiconductor light emitting element 230.

It is preferred that sealing resin 280 is filled to have an upper surface substantially parallel to the surface of semiconductor light emitting element 230 and the surfaces of first and second lead frames 270 and 271. By such an arrangement, the light that reached the upper surface through sealing resin 280 can substantially fully be emitted to the outside of semiconductor light emitting device 200 and, therefore, the efficiency of using light emitted from semiconductor light emitting element 230 can be improved.

In the following, the method of manufacturing semiconductor light emitting device 200 in accordance with the present embodiment will be described.

First, in a mold holding a plurality of first and second lead frames 270 and 271, white resin is poured, so that a plurality of packages 290 are formed by insert molding.

Thereafter, in order to remove burrs, blasting is done. When thermosetting resin is used, burrs generate at the molding process. Therefore, blasting is done to remove burrs. By the blasting, the surfaces of first and second lead frames 270 and 271 are frosted and, therefore, reflectance decreases. For this reason, blasting may be done with the surfaces of first and second lead frames covered by a protective sheet.

Next, semiconductor light emitting element 230 is die-bonded and wire-bonded. Thereafter, sealing resin 280 is filled to cavity 260.

A cutting tape is adhered to a lower surface of the substrate, and the substrate is cut into dices using a blade, so that the semiconductor light emitting devices 200 are divided into individual pieces. The plurality of semiconductor light emitting devices 200 cut into individual pieces are held together and not fall apart, because of the cutting tape. Finally, the cutting tape is removed, and thus, a plurality of semiconductor light emitting devices 200 are obtained.

In semiconductor light emitting device 200 in accordance with the present embodiment also, serrated structures 211 are formed and, therefore, at least part of the light emitted from semiconductor light emitting element 230 to the substrate can be reflected in a direction perpendicular to the upper surface of the substrate. By this structure, the efficiency of using light emitted from semiconductor light emitting element 230 can be improved.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor light emitting device, comprising:
    a substrate provided with a wiring pattern; and
    a semiconductor light emitting element mounted on a top surface of said substrate and electrically connected to said wiring pattern; wherein
    said substrate has, on said top surface, a serrated structure for reflecting at least part of light, emitted from said semiconductor light emitting element to said substrate, in a direction perpendicular to said top surface so that said at least part of the light is reflected toward a side of the substrate on which the semiconductor light emitting element is mounted.

2. The semiconductor light emitting device according to claim 1, wherein
    said serrated structure includes a plurality of serrated structures positioned in concentric circular patterns with said semiconductor light emitting element being the center, when viewed two-dimensionally.

3. The semiconductor light emitting device according to claim 1, wherein
    said serrated structure includes a plurality of serrated structures positioned in concentric rectangular patterns with said semiconductor light emitting element being the center, when viewed two-dimensionally.

4. The semiconductor light emitting device according to claim 1, wherein said serrated structure includes a plurality of serrated structures positioned in concentric rectangular patterns on an inner side and in concentric circular patterns on an outer side, with said semiconductor light emitting element being the center, when viewed two-dimensionally.

5. The semiconductor light emitting device according to claim 1, wherein
said substrate further has a reflector portion having a substantially rectangular outer shape when viewed two-dimensionally and surrounding an edge; and
said serrated structure includes a plurality of serrated structures extending in a direction perpendicular to the longitudinal direction of said substrate and positioned spaced from each other in said longitudinal direction.

6. The semiconductor light emitting device according to claim 5, wherein
said serrated structures are further positioned in rectangular patterns to surround said semiconductor light emitting element.

7. The semiconductor light emitting element according to claim 1, wherein
said serrated structure is positioned not to overlap with a position of connection between said wiring pattern and said semiconductor light emitting element.

8. The semiconductor light emitting device according to claim 1, wherein
said serrated structure is formed apart by a distance at least 1 and at most 1.5 times the thickness of the semiconductor light emitting element, from a peripheral side surface of said semiconductor light emitting element.

9. The semiconductor light emitting device according to claim 8, wherein
said serrated structure has a saw-tooth shape in transverse section, and has a plurality of inclinations serving as reflecting surfaces for reflecting light emitted from said semiconductor light emitting element; and
when H represents a thickness of said semiconductor light emitting element, L represents the shortest distance between a crossing line of the closest inclination closest to said semiconductor light emitting element among a plurality of inclinations and said one upper surface and the peripheral side surface of said semiconductor light emitting element, and $\theta$ represents an inner angle formed by the closest inclination and said one upper surface, said closest inclination satisfies the relation of $2\theta = 90° - \tan^{-1}(H/L)$.

10. The semiconductor light emitting device according to claim 9, wherein the relation of $30° \leq \theta \leq 45°$ is satisfied.

11. The semiconductor light emitting device according to claim 9, wherein where Lp represents distance between vertexes of adjacent peaks, h represents height of the vertex, and $\theta p$ represents an inner angle of the inclination positioned between each of the vertexes in the transverse section of said serrated structure, the relation of $Lp = h/\tan \theta p$ is satisfied.

12. The semiconductor light emitting device according to claim 1 wherein said serrated structure is formed of ceramic.

13. The semiconductor light emitting device according to claim 1, wherein said serrated structure is formed of metal.

14. The semiconductor light emitting device according to claim 13, wherein said serrated structure has its surface mirror-finished.

15. The semiconductor light emitting device according to claim 14, wherein said serrated structure has its surface formed of silver.

* * * * *